US009570533B2

(12) United States Patent
Zhang et al.

(10) Patent No.: US 9,570,533 B2
(45) Date of Patent: Feb. 14, 2017

(54) ORGANIC LIGHT EMITTING DIODE ARRAY SUBSTRATE, ITS MANUFACTURING METHOD, AND DISPLAY DEVICE

(71) Applicant: BOE TECHNOLOGY GROUP CO., LTD., Beijing (CN)

(72) Inventors: Can Zhang, Beijing (CN); Libin Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/758,135

(22) PCT Filed: Jan. 16, 2015

(86) PCT No.: PCT/CN2015/070882
§ 371 (c)(1),
(2) Date: Jun. 26, 2015

(87) PCT Pub. No.: WO2016/045269
PCT Pub. Date: Mar. 31, 2016

(65) Prior Publication Data
US 2016/0254341 A1    Sep. 1, 2016

(30) Foreign Application Priority Data
Sep. 23, 2014   (CN) .......................... 2014 1 0491588

(51) Int. Cl.
*H01L 27/32* (2006.01)
*H01L 51/52* (2006.01)
*H01L 51/56* (2006.01)

(52) U.S. Cl.
CPC .......... *H01L 27/3279* (2013.01); *H01L 27/32* (2013.01); *H01L 27/3246* (2013.01); *H01L 51/52* (2013.01);
(Continued)

(58) Field of Classification Search
CPC ............... H01L 27/3279; H01L 27/329; H01L 27/3246; H01L 27/32; H01L 27/3225; H01L 27/3244; H01L 27/3237; H01L 27/3281; H01L 27/3283; H01L 2251/566; H01L 2227/323; H01L 2227/32; H01L 2924/301; H01L 2924/30101; H01L 51/56; H01L 51/50; H01L 2251/301; H01L 2251/56
See application file for complete search history.

(56) References Cited

U.S. PATENT DOCUMENTS

2007/0194307 A1   8/2007 Kim et al.
2008/0252201 A1*  10/2008 Pearce ................ H01L 51/0015
                                                       313/504
(Continued)

FOREIGN PATENT DOCUMENTS

CN       1964056 A      5/2007
CN     102110685 A      6/2011
(Continued)

OTHER PUBLICATIONS

First Office Action regarding Chinese application No. 201410491588.5, dated Aug. 1, 2016. Translation provided by Dragon Intellectual Property Law Firm.
(Continued)

*Primary Examiner* — Galina Yushina
(74) *Attorney, Agent, or Firm* — Harness, Dickey & Pierce, P.L.C.

(57) ABSTRACT

The present disclosure provides an organic light emitting diode array substrate and its manufacturing method, as well as a display device. The organic light emitting diode array substrate includes: gate lines, data lines, and a plurality of pixel units defined by the gate lines and the data lines. Each pixel unit comprises a first region which emits light and a second region which does not emit light. The first region is
(Continued)

provided with an organic light emitting diode, and the second region is provided with a conductive unit which is electrically connected in parallel with the data line and created from the same layer from which a cathode of the organic light emitting diode is created.

20 Claims, 3 Drawing Sheets

(52) U.S. Cl.
CPC ........... *H01L 51/5234* (2013.01); *H01L 51/56* (2013.01); *H01L 2227/323* (2013.01); *H01L 2251/301* (2013.01); *H01L 2924/0002* (2013.01)

(56) References Cited

U.S. PATENT DOCUMENTS

| | | | |
|---|---|---|---|
| 2011/0273410 A1* | 11/2011 | Park | ...................... H01L 25/167 345/204 |
| 2012/0050235 A1* | 3/2012 | Park | ...................... H01L 27/3276 345/204 |
| 2012/0169699 A1* | 7/2012 | Shin | ...................... H01L 27/3279 345/211 |
| 2013/0200399 A1* | 8/2013 | Jin | ...................... H01L 27/3276 257/88 |

FOREIGN PATENT DOCUMENTS

| | | |
|---|---|---|
| CN | 102376896 A | 3/2012 |
| CN | 103247619 A | 8/2013 |
| CN | 103700675 A | 4/2014 |
| CN | 104253148 A | 12/2014 |

OTHER PUBLICATIONS

Written Opinion of the International Searching Authority for international application No. PCT/CN2015/070882.

* cited by examiner

ORGANIC LIGHT EMITTING DIODE ARRAY SUBSTRATE, ITS MANUFACTURING METHOD, AND DISPLAY DEVICE

CROSS-REFERENCE TO RELATED APPLICATIONS

This application is the U.S. national phase of PCT Application No. PCT/CN2015/070882 filed on Jan. 16, 2015, which claims a priority of the Chinese Patent Application No. 201410491588.5 filed on Sep. 23, 2014, the disclosures of which are incorporated in their entirety by reference herein.

TECHNICAL FIELD

The present disclosure relates to the field of organic light emitting diode (OLED) display, in particular to an organic light emitting diode array substrate and its manufacturing method, as well as a display device.

BACKGROUND

As a new display technology, a transparent display may allow a viewer to observe a background behind a display screen. Such a novel display effect broadens the application field of display, which may be applied to display devices such as a mobile phone, a laptop PC, a display window, a refrigerator door, an on-board monitor and an advertising board.

Referring to FIG. 1, which is a schematic view showing a pixel structure of a transparent OLED display panel in the related art, the pixel structure includes: a luminous region 10 and a nonluminous transparent region 20, wherein a nontransparent thin film transistor (TFT) and an organic light emitting diode (not shown in FIG. 1) are arranged at the luminous region. A cathode layer 11 is a semitransparent cathode, and located at both the luminous region 10 and the nonluminous region 20. A metal data line 21, which decreases the light transmittance of the transparent OLED display panel, is arranged longitudinally at the nonluminous transparent region 20. A width of the metal data line 21 may be reduced, or a data line may be made of a transparent metallic oxide (e.g., indium tin oxide (ITO)) instead of the metal material, so as to increase the light transmittance of the transparent OLED display panel. However, when the width of the metal data line is reduced or the data line is made of the transparent metallic oxide, it will lead to an increased resistance. As a result, it is able to lead to an increase in an IR drop of the OLED display device, thereby to adversely affect a display effect of the OLED display panel.

SUMMARY

An object of the present disclosure is to provide an organic light emitting diode (OLED) array substrate, its manufacturing method, and a display device, so as to reduce a resistance of a data line in the transparent OLED array substrate.

In one aspect, the present disclosure provides in embodiments an OLED array substrate, including gate lines, data lines, and a plurality of pixel units defined by the gate lines and the data lines. Each pixel unit comprises a first region which emits light and a second region which does not emit light. The first region is provided with an organic light emitting diode, and the second region is provided with a conductive unit, which is electrically connected in parallel with the data line and created from the same layer from which a cathode of the organic light emitting diode is created.

In some embodiments, the data line is electrically connected in parallel with the conductive unit through at least two via holes.

In some embodiments, the OLED array substrate further includes a separating portion, through which the cathode is insulated and separated from the conductive unit.

In some embodiments, the separating portion is of a rectangle frame-like shape, and the conductive unit is arranged within the separating portion.

In some embodiments, a top of the separating portion is higher than those of the cathode and the conductive unit.

In some embodiments, the top of the separating portion is 2 µm to 5 µm higher than those of the cathode and the conductive unit.

In some embodiments, the separating portion is columnar and of a cross section in an inverted trapezoidal shape.

In some embodiments, the conductive unit and the cathode of the organic light emitting diode are each made of a translucent metal material.

In some embodiments, the translucent metal material is Ag, Mg or Al, or an alloy thereof.

In some embodiments, the conductive unit or the cathode of the organic light emitting diode is of a thickness of 10 nm to 30 nm.

In another aspect, the present disclosure provides in embodiments a method for manufacturing an OLED array substrate, including steps of forming gate lines and data lines, and forming a plurality of pixel units defined by the gate lines and the data lines. Each pixel unit comprises a first region which emits light and a second region which does not emit light. The first region is provided with an organic light emitting diode, and the second region is provided with a conductive unit which is electrically connected in parallel with the data line and created from the same layer from which a cathode of the organic light emitting diode is created.

In some embodiments, the step of forming the plurality of pixel units includes:

providing a base substrate;

forming an anode of the organic light emitting diode and a pixel-defined layer on the base substrate, and forming a via hole penetrating the pixel-defined layer at a position corresponding to the data line;

forming an organic layer of the organic light emitting diode on the anode;

forming a separating portion on the pixel-defined layer; and forming a cathode metal layer having a top lower than that of the separating portion and divided by the separating portion into two parts, one part serving as the cathode of the organic light emitting diode and the other part serving as the conductive unit which is electrically connected to the data line through the via hole.

In yet another aspect, the present disclosure provides in embodiments an OLED display device, including the above-mentioned OLED array substrate.

The present disclosure has the following advantageous effects. According to embodiments of the present disclosure, the conductive unit arranged at the nonluminous region of the pixel unit is electrically connected in parallel with the data line. As a result, it is able to reduce the resistance of the data line, thereby to reduce an adverse effect caused by an IR drop on the organic light emitting diode.

Furthermore, according to embodiments of the present disclosure, the cathode metal layer may be insulated and separated by the separating portion, so that one part located at the luminous region of the pixel unit serves as the cathode of the organic light emitting diode, and the other part located at the nonluminous region of the pixel unit serves as the conductive unit. As a result, it is able to achieve the OLED array substrate in a simpler manner, and to reduce the production cost thereof.

DETAILED DESCRIPTION

In order to make the objects, the technical solutions and the advantages of the present disclosure more apparent, the present disclosure will be described hereinafter in conjunction with the drawings and embodiments.

Figure 1:
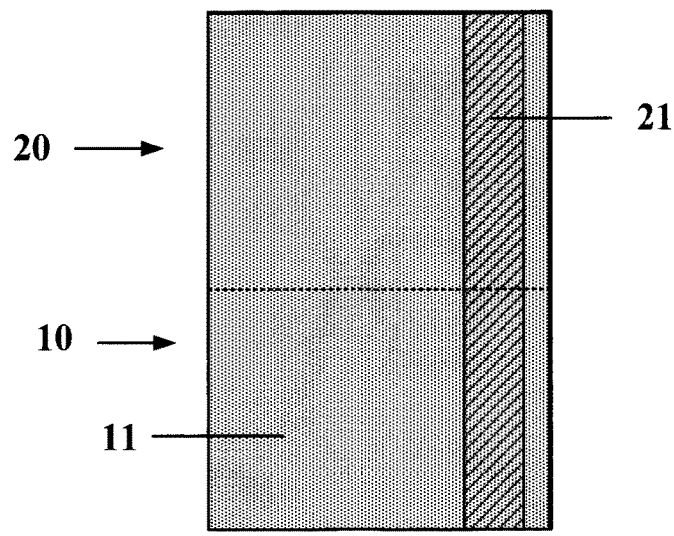
FIG. 1 is a schematic view showing a pixel structure of an OLED display panel in the related art.
Figure 2:
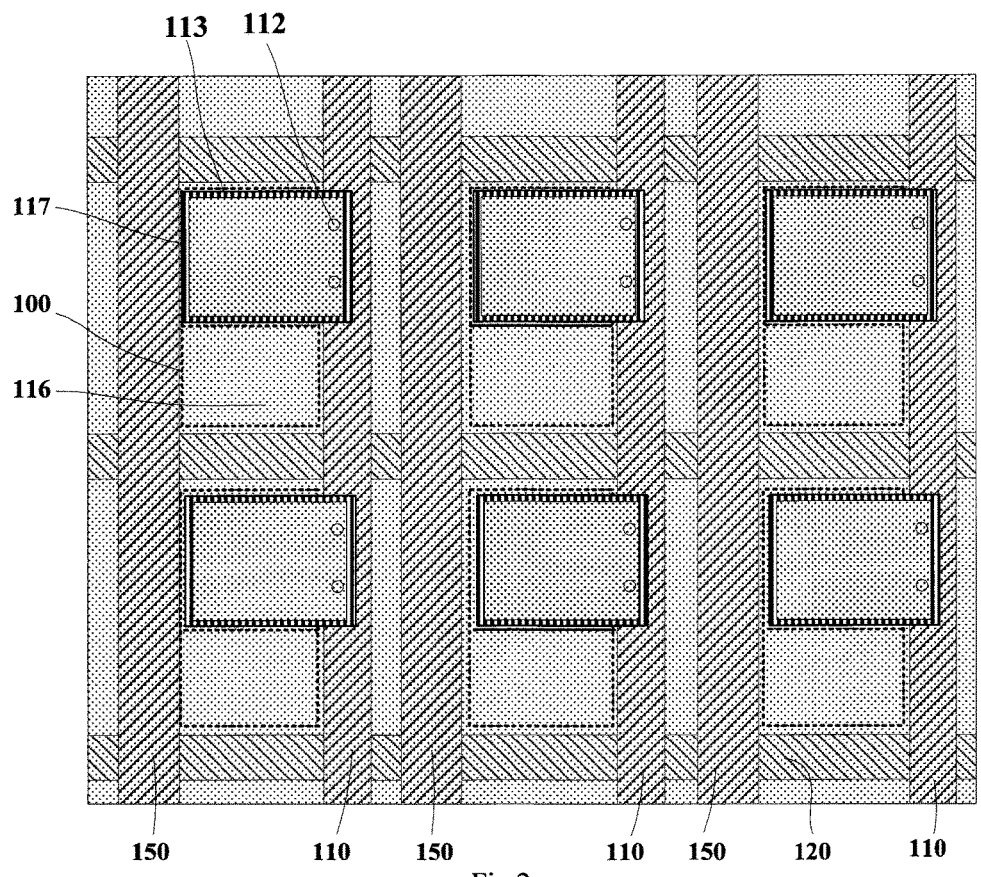
FIG. 2 is a top view of an OLED array substrate according to an embodiment of the present disclosure.
Figure 3:
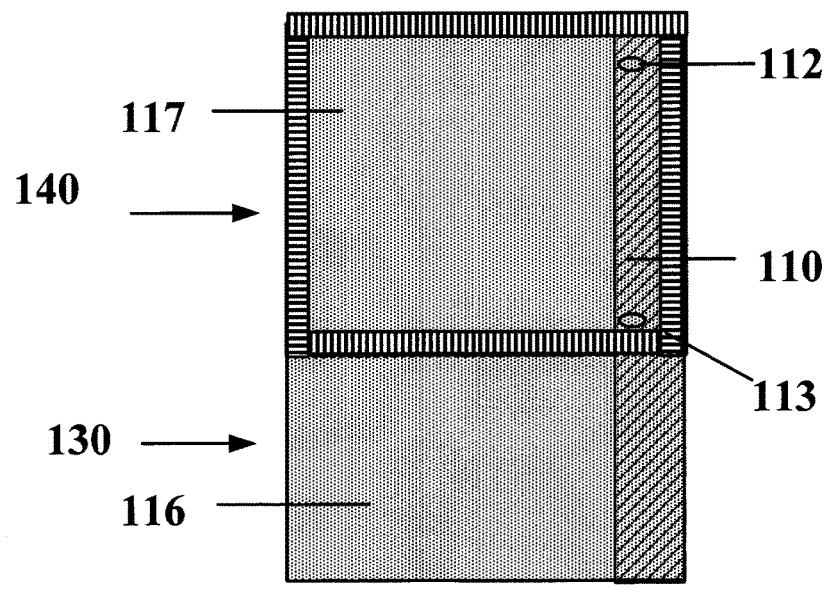
FIG. 3 is an enlarged, top view of a pixel unit according to an embodiment of the present disclosure.

To solve a problem that a data line in a transparent OLED array substrate is of a large resistance in the related art, as shown in FIGS. 2 and 3, the present disclosure provides in embodiments an OLED array substrate, including: a power line 150, a gate line 120, a data line 110, and a plurality of pixel units 100 defined by the gate lines 120 and the data lines 110. Each pixel unit 100 includes: a first region 130 which emits light and a second region 140 which does not emit light. The first region 130 is provided with an organic light emitting diode (only a cathode 116 of the organic light emitting diode is shown in the drawings), and the second region 140 is provided with a conductive unit 117 which is electrically connected in parallel with the data line 110 and created from the same layer from which the cathode 116 of the organic light emitting diode is created. The power line 150 is used to supply power to an anode of the organic light emitting diode.

According to embodiments of the present disclosure, the conductive unit 117, arranged at the nonluminous region of the pixel unit 100, is electrically connected in parallel with the data line 110. As a result, it is able to reduce a resistance of the data line 110, thereby to reduce an adverse effect caused by an IR drop on the organic light emitting diode.

In an embodiment of the present disclosure, the pixel unit may further include a thin film transistor arranged at the first region 130 which emits light, electrically connected to the organic light emitting diode, and configured to drive the organic light emitting diode to emit light.

Further, the OLED array substrate according to embodiments of the present disclosure may further include a pixel-defined layer.

In the present embodiment, the data line 110 is electrically connected in parallel with the conductive unit 117 through at least two via holes 112.

The cathode 116 and the conductive unit 117 are created from the same layer and made of an identical material, usually a metal material. In some embodiments, the cathode 116 and the conductive unit 117 may be made of a semi-transparent metal material, so that the second region 140 which does not emit light is a semitransparent region, thereby to achieve transparent display. To be specific, the cathode 116 and the conductive unit 117 may each be made of Ag, Mg or Al, or an alloy thereof, and they may each be of a thickness of 10 nm to 30 nm.

To improve the light transmittance of the transparent OLED array substrate, in some embodiments, the data line 110 may be made of a transparent metallic oxide, such as indium tin oxide (ITO) or indium zinc oxide (IZO). The data line made of the transparent metallic oxide may be created from the same layer from which the anode of the organic light emitting diode is created. When the anode is of a multi-layer structure including a metallic oxide layer and a metallic reflecting layer, the data line may also be formed at the same time with the metallic oxide layer of the anode by a single patterning process.

In addition, the data line may also be made of a metal material. In some embodiments, the data line may be formed at the same time with a source/drain electrode of the thin film transistor by a single patterning process, i.e., the data line is made of a metal material identical to the source/drain electrode of the thin film transistor. At this time, the data line and the source/drain electrode of the thin film transistor are arranged at the same layer.

According to the embodiments of the present disclosure, the OLED array substrate may further include: a separating portion, through which the cathode 116 and the conductive unit 117 are insulated and separated from each other.

In some embodiments, as shown in FIGS. 2 and 3, the separating portion 113 is of a rectangle frame-like shape, and the conductive unit 117 is arranged within the separating portion 113, i.e., the conductive unit 117 is surrounded by the separating portion 113.

In some embodiments, a top of the separating portion 113 is higher than that of the cathode 116 and that of the conductive unit 117, and the top of the separating portion 113 is 2 μm to 5 μm higher than that of the cathode 116 and that of the conductive unit 117.

According to the embodiments of the present disclosure, the separating portion 113 may be formed prior to the formation of a cathode metal layer by an open mask (a co-layer metal mask) process. As the cathode metal layer has the top lower than that of the separating portion 113, the metal layer can be insulated and separated by the separating portion 113, so that the cathode 116 of the organic light emitting diode is formed at the first region 130 of the pixel unit 100, and the conductive unit 117 is formed at the second region 140 of the pixel unit 100. In some embodiments, the separating portion 113 is columnar and of a cross section in an inverted trapezoidal shape.

Because a part of the existing cathode layer, i.e., the conductive unit, is used to reduce the resistance of the data line 110, it is able to achieve the OLED array substrate in a simpler manner and reduce the production cost thereof.

Of course, in the other embodiments of the present disclosure, the cathode and the conductive unit which are insulated and separated from each other may also be formed by a patterning process.

Figure 4:
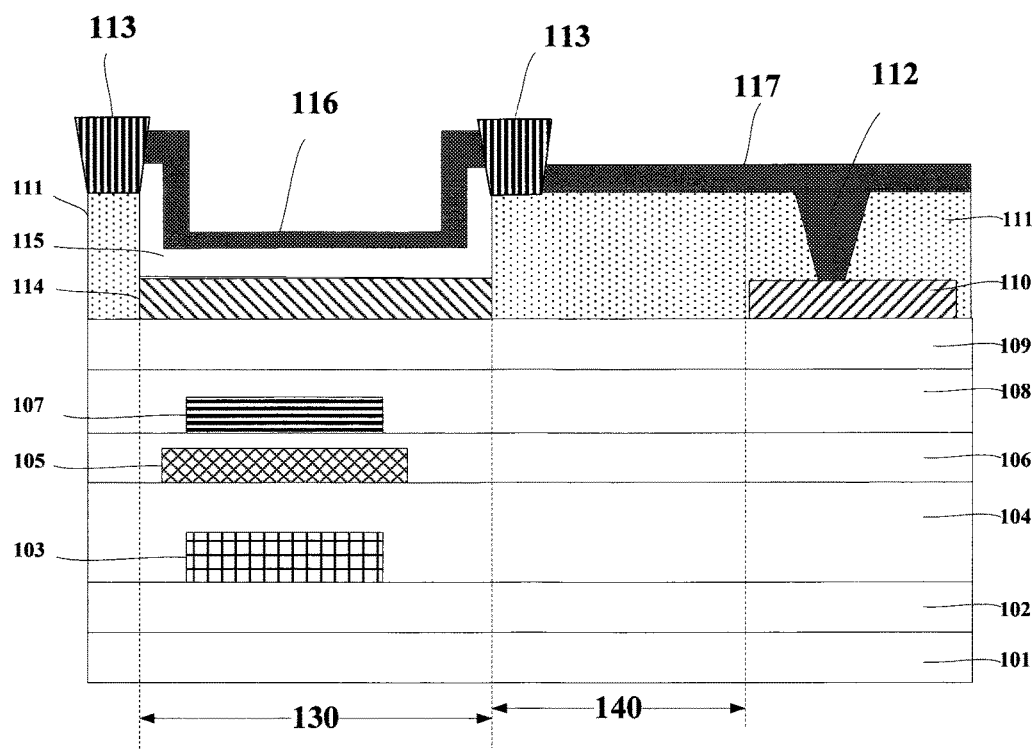
FIG. 4 is a sectional view of an OLED array substrate according to an embodiment of the present disclosure.

Referring to FIG. 4, which is a sectional view of an OLED array substrate according to an embodiment of the present disclosure, the OLED array substrate includes:

a base substrate 101;

a buffer layer 102 covering the base substrate 101;

an active layer 103 arranged on the buffer layer 102;

a gate insulating layer 104 covering the active layer 103;

a gate electrode 105 arranged on the gate insulating layer 104;

an interlayer insulating layer 106 covering the gate electrode 105;

a source/drain electrode 107 arranged on the interlayer insulating layer 106;

a passivation layer 108 covering the source/drain electrode 107;

a planarization layer 109 covering the passivation layer 108;

a data line 110 arranged on the planarization layer 109;

a pixel-defined layer 111 arranged on the data line 110 and having at least two via holes 112;

a separating portion 113 which is arranged on the pixel-defined layer 111, is of a rectangle frame-like shape and has a cross section in a columnar and inverted trapezoidal shape;

an anode 114 arranged on the planarization layer 109 and at the same layer with the data line 110;

an organic layer 115 arranged on the anode 114;

a cathode 116 arranged on the organic layer 115; and a conductive unit 117 created from the same layer from which the cathode is created and made of an identical material to the cathode 116, and arranged on the pixel-defined layer 111, the cathode 116 and the conductive unit 117 being insulated and separated from each other by the separating portion 113, and the conductive unit 117 being electrically connected in parallel with the data line 110 through the via hole 112 penetrating the pixel-defined layer 111.

The thin film transistor of the pixel unit consists of the active layer 103, the gate insulating layer 104, the gate electrode 105, the interlayer insulating layer 106 and the source/drain electrode 107. The organic light emitting diode of the pixel unit consists of the anode 114, the organic layer 115 and the cathode 116.

Figure 5:
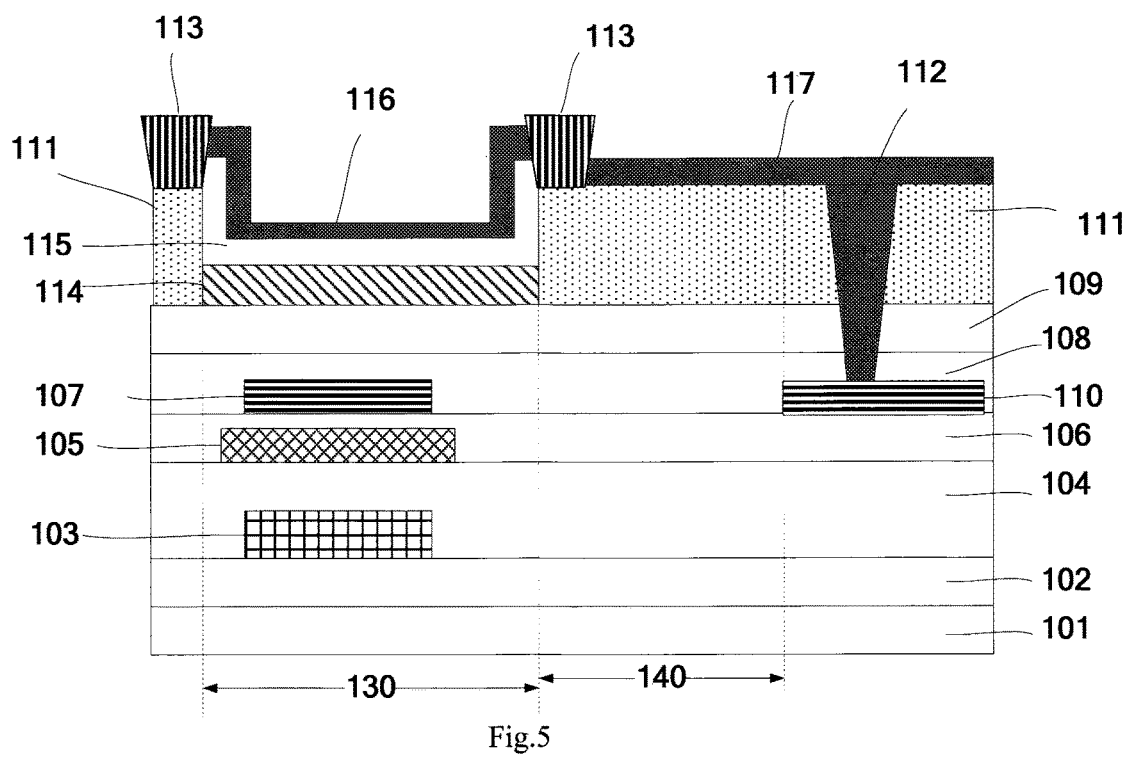
FIG. 5 is another sectional view of an OLED array substrate according to an embodiment of the present disclosure.

Referring to FIG. 5, which is another sectional view of the OLED array substrate according to an embodiment of the present disclosure, the OLED array substrate includes:

a base substrate 101;

a buffer layer 102 covering the base substrate 101;

an active layer 103 arranged on the buffer layer 102;

a gate insulating layer 104 covering the active layer 103;

a gate electrode 105 arranged on the gate insulating layer 104;

an interlayer insulating layer 106 covering the gate electrode 105;

a source/drain electrode 107 arranged on the interlayer insulating layer 106;

a data line 110 arranged on the interlayer insulating layer 106 and at the same layer with and made of an identical material to the source/drain electrode 107;

a passivation layer 108 covering the source/drain electrode 107 and the data line 110;

a planarization layer 109 covering the passivation layer 108;

a pixel-defined layer 111 arranged on the planarization layer 109;

a separating portion 113 which is arranged on the pixel-defined layer 111, is of a rectangle frame-like shape and has a cross section in a columnar and inverted trapezoidal shape;

an anode 114 arranged on the planarization layer 109;

an organic layer 115 arranged on the anode 114;

a cathode 116 arranged on the organic layer 115; and a conductive unit 117 created from the same layer from which the cathode is created and made of an identical material to the cathode 116, and arranged on the pixel-defined layer 111, the cathode 116 and the conductive unit 117 being insulated and separated from each other by the separating portion 113, and the conductive unit 117 being electrically connected in parallel with the data line 110 through the via hole 112 penetrating the pixel-defined layer 111, the planarization layer 109 and the passivation layer 108.

The thin film transistor of the pixel unit consists of the active layer 103, the gate insulating layer 104, the gate electrode 105, the interlayer insulating layer 106 and the source/drain electrode 107. The organic light emitting diode of the pixel unit consists of the anode 114, the organic layer 115 and the cathode 116.

In the above two embodiments, the thin film transistor is of a top-gate structure. In the other embodiments of the present disclosure, the thin film transistor may also be of a bottom-gate structure.

The present disclosure further provides in embodiments an OLED display device, including the above-mentioned OLED array substrate.

The present disclosure further provides in embodiments a method for manufacturing an OLED array substrate, including steps of gate lines and data lines, and forming a plurality of pixel units defined by the gate lines and the data lines. Each pixel unit includes a first region which emits light and a second region which does not emit light. The first region is provided with an organic light emitting diode, and the second region is provided with a conductive unit which is electrically connected in parallel with the data line and created from the same layer from which a cathode of the organic light emitting diode is created.

According to embodiments of the present disclosure, the conductive unit, arranged at the nonluminous region of the pixel unit, is electrically connected in parallel with the data line. As a result, it is able to reduce the resistance of the data line, thereby to reduce the adverse effect caused by the IR drop on the organic light emitting diode.

In some embodiments, the step of forming the plurality of pixel units further includes:

providing a base substrate;

forming an anode of an organic light emitting diode and a pixel-defined layer on the base substrate, and forming a via hole penetrating the pixel-defined layer at a position corresponding to the data line;

forming an organic layer of the organic light emitting layer on the anode;

forming a separating portion on the pixel-defined layer;

forming a cathode metal layer having a top lower than that of the separating portion and divided by the separating portion into two parts, one part of the cathode metal layer serving as the cathode of the organic light emitting diode, and the other part of the cathode metal layer serving as a conductive unit which is electrically connected to the data line through the via hole.

According to embodiments of the present disclosure, a part of the existing cathode layer is used to reduce the resistance of the data line. As a result, it is able to achieve the OLED array substrate in a simpler manner and reduce the production cost thereof In one embodiment, the step of forming the plurality of pixel units includes:

S11: providing a base substrate;

S12: forming a thin film transistor on the base substrate;

S13: forming a data line and an anode of an organic light emitting diode on the base substrate with the thin film transistor;

S14: forming a pixel-defined layer and a separating portion, and forming at least two via holes penetrating the pixel-defined layer at a position corresponding to the data line;

S15: forming an organic layer of the organic light emitting diode on the anode; and S16: forming a cathode metal layer divided into two parts by the separating portion, one part of the cathode metal layer serving as the cathode of the organic light emitting diode, and the other part being electrically connected in parallel with the data line through the via hole.

In the present embodiment, the data line may be made of a transparent metallic oxide.

In another embodiment, the step of forming the plurality of pixel units includes:

S21: providing a base substrate;

S22: forming a thin film transistor and a data line on the base substrate, the data line and a source/drain electrode of the thin film transistor being formed by a single patterning process;

S23: forming a passivation layer and a planarization layer covering the thin film transistor and the data line;

S24: forming an anode of the organic light emitting diode;

S25: forming a pixel-defined layer and a separating portion, and forming at least two via holes penetrating the pixel-defined layer, the planarization layer and the passivation layer at a position corresponding to the data line;

S26: forming an organic layer of the organic light emitting diode above the anode;

S27: forming a cathode metal layer divided into two parts by the separating portion, one part of the cathode metal layer serving as the cathode of the organic light emitting diode, and the other part being electrically connected in parallel with the data line through the via hole.

In the present embodiment, the data line and the source/drain electrode of the thin film transistor are made of an identical metal material.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. An organic light emitting diode (OLED) array substrate, comprising: gate lines, data lines, and a plurality of pixel units defined by the gate lines and the data lines,
   wherein each pixel unit comprises a first region which emits light and a second region which does not emit light,
   the first region is provided with an organic light emitting diode, and
   the second region is provided with a conductive unit, which is electrically connected in parallel with a corresponding data line and created from a same layer from which a cathode of the organic light emitting diode is created.

2. The OLED array substrate according to claim 1, wherein the data line is electrically connected in parallel with the conductive unit through at least two via holes.

3. The OLED array substrate according to claim 1, further comprising a separating portion, through which the cathode is insulated and separated from the conductive unit.

4. The OLED array substrate according to claim 3, wherein the separating portion is of a rectangle frame-like shape, and the conductive unit is arranged inside the separating portion.

5. The OLED array substrate according to claim 3, wherein a top of the separating portion is higher than those of the cathode and the conductive unit.

6. The OLED array substrate according to claim 5, wherein the top of the separating portion is 2 μm to 5 μm higher than those of the cathode and the conductive unit.

7. The OLED array substrate according to claim 5, wherein the separating portion is columnar and of a cross section in an inverted trapezoidal shape.

8. The OLED array substrate according to claim 1, wherein the conductive unit and the cathode of the organic light emitting diode are each made of a translucent metal material.

9. The OLED array substrate according to claim 8, wherein the translucent metal material is Ag, Mg or Al, or an alloy thereof.

10. The OLED array substrate according to claim 1, wherein the conductive unit and the cathode of the OLED are each of a thickness of 10 nm to 30 nm.

11. A method for manufacturing an organic light emitting diode (OLED) array substrate, comprising the following steps:
    forming gate lines and data lines, and forming a plurality of pixel units defined by the gate lines and the data lines,
    wherein each pixel unit comprises a first region which emits light and a second region which does not emit light, the first region is provided with an OLED, and the second region is provided with a conductive unit which is electrically connected in parallel with a corresponding data line and created from a same layer from which a cathode of the OLED is created.

12. The method according to claim 11, wherein the step of forming the plurality of pixel units comprises:
    providing a base substrate;
    forming an anode of the organic light emitting diode and a pixel-defined layer on the base substrate, and forming a via hole penetrating the pixel-defined layer at a position corresponding to the data line;
    forming an organic layer of the OLED on the anode;
    forming a separating portion on the pixel-defined layer; and
    forming a cathode metal layer having a top lower than that of the separating portion and divided into two parts by the separating portion, one part of the cathode metal layer serving as the cathode of the OLED and another part of the cathode metal serving as the conductive unit which is electrically connected to the data line through the via hole.

13. An organic light emitting diode (OLED) display device, comprising the OLED array substrate according to claim 1.

14. The OLED display device according to claim 13, wherein the data line is electrically connected in parallel with the conductive unit through at least two via holes.

15. The OLED display device according to claim 13, further comprising a separating portion, through which the cathode is insulated and separated from the conductive unit.

16. The OLED display device according to claim 15, wherein the separating portion is of a rectangle frame-like shape, and the conductive unit is arranged inside the separating portion.

17. The OLED display device according to claim 15, wherein a top of the separating portion is higher than those of the cathode and the conductive unit.

18. The OLED display device according to claim 17, wherein the top of the separating portion is 2 μm to 5 μm higher than those of the cathode and the conductive unit.

19. The OLED display device according to claim 17, wherein the separating portion is columnar and of a cross section in an inverted trapezoidal shape.

20. The OLED display device according to claim 13, wherein the conductive unit and the cathode of the organic light emitting diode are each made of a translucent metal material.

\* \* \* \* \*